United States Patent [19]

Hurst et al.

[11] 4,021,852
[45] May 3, 1977

[54] SIGNAL DEFECT COMPENSATION

[75] Inventors: Robert Norman Hurst, Cherry Hill;
Robert Adams Dischert, Burlington Township, both of N.J.

[73] Assignee: RCA Corporation, New York, N.Y.

[22] Filed: Aug. 21, 1975

[21] Appl. No.: 606,480

[52] U.S. Cl. .................................. 360/38; 358/8; 360/64
[51] Int. Cl.² .................................... H04N 5/795
[58] Field of Search .......... 360/38, 64; 178/6.6 DC, 178/6.6 HS; 358/8

[56] References Cited

UNITED STATES PATENTS

| | | | |
|---|---|---|---|
| 2,996,576 | 8/1961 | Polby | 360/38 |
| 3,553,390 | 1/1971 | Krause | 178/6.6 HS |
| 3,925,811 | 12/1975 | Kenney | 360/38 |

FOREIGN PATENTS OR APPLICATIONS 1,939,682  3/1971  Germany ..................... 178/6.6 DC

*Primary Examiner*—Raymond F. Cardillo, Jr.

*Attorney, Agent, or Firm*—Mason DeCamillis; Eugene M. Whitacre

[57] ABSTRACT

A system is provided for compensating for signal defects such as dropouts in recorded television signals. A recovered video signal is delayed for a period of substantially one scanning line, and the delayed signal is coupled to two channels, one for the luminance and scan synchronizing information and the other for the color information. The color information is phase-reversed each time it is delayed so as to provide a proper phase relationship when reinserting the delayed information into the signal path. The two channels are recombined to provide a compensating signal which is substituted for the original video signal during a dropout. In addition, when a head-switching transient such as occurs in a quadruplex VTR is sensed, a further mode of operation is activated in which the system substitutes a portion of the prior line horizontal blanking interval for the duration of the switching transient so as to prevent degradation of the synchronizing signal and resultant disturbance to the operation of the recorder servo systems.

6 Claims, 2 Drawing Figures

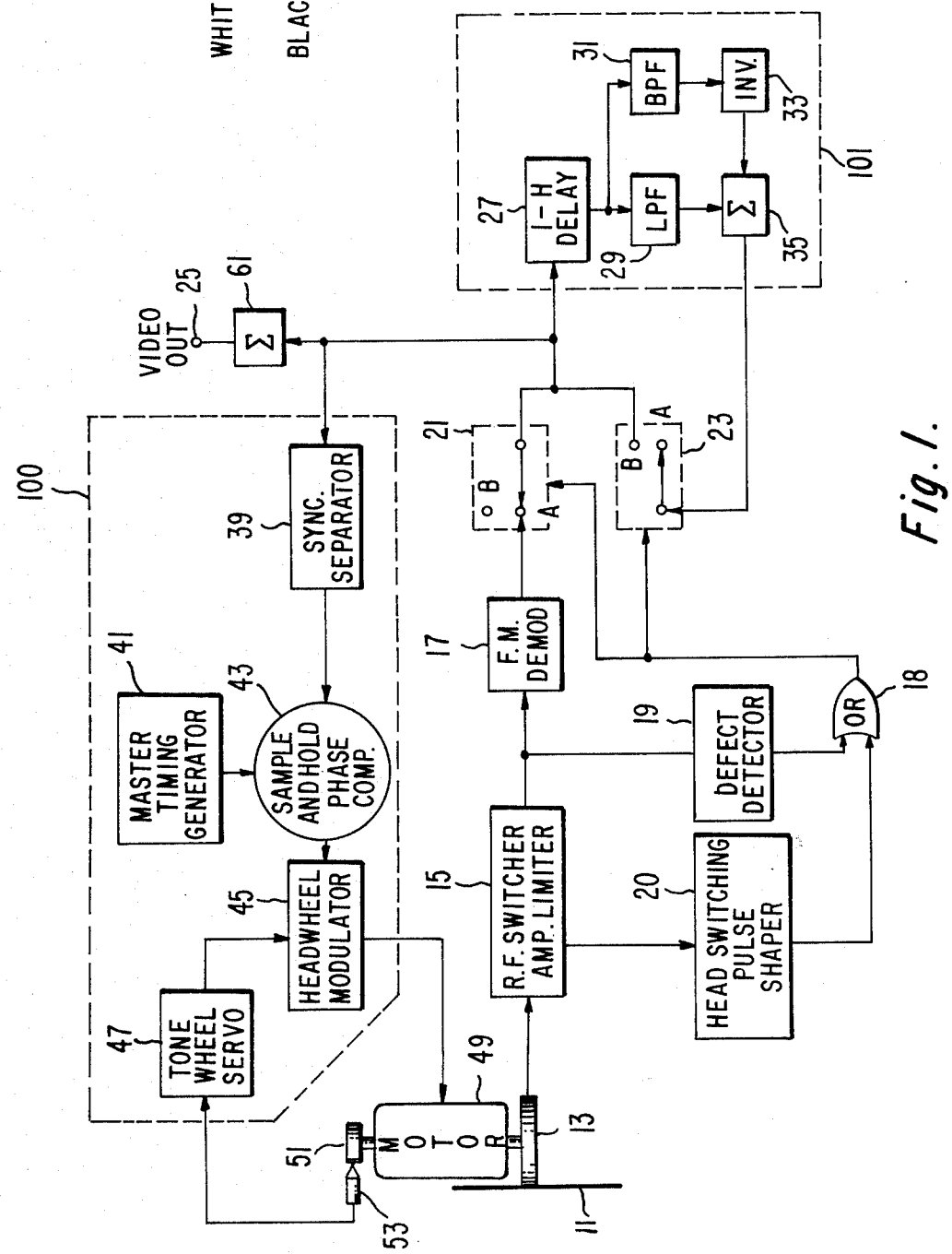

SIGNAL DEFECT COMPENSATION

BACKGROUND OF THE INVENTION

This invention relates to a signal defect compensator which may be used in a system for reproducing recorded television image information and, more particularly, to a signal defect compensator having a plurality of operating modes which are selected automatically according to the form of a particular defect.

In the reproduction of television video signals from information recorded, for example, on magnetic tape, magnetic discs or other types of recording media, a decrease or loss of the recorded high frequency signal information may be encountered. A form of defect known as a dropout may occur due to imperfections in the tape or other medium used for the video recording or due to the subsidiary equipment used in the video recorder. When the dropout in the playback signal occurs, it causes a disturbance in the reproduced video signal which appears usually in the form of random black and white streaks or flashes on the screen of the television receiver or other reproducer.

Another form of signal defect known as switching transients may also occur, particularly in a multiple head video tape recorder (VTR), as the multiple heads are sequentially switched during playback of the recorded information.

It is known that television image information is to some extent redundant from line to line. Dropout compensators (DOC) therefore generally have operated on the principle that since the information is redundant from line to line, it is possible to compensate for dropout by substituting information from a previous image line. Known defect compensators therefore store image information from a previous line and insert the previous line of stored information into the video signal when a signal dropout occurs. However, such compensators which generally rely on a loss of signal for activation will not operate in response to a switching transient defect.

In a multi-head VTR it is common practice, in the recording mode, to have two recording heads in contact with the tape simultaneously; one head just completing its excursion across the tape, and the other just beginning its excursion. During a brief interval, the two heads record redundant information; e.g., in a quadruplex VTR, the overlap is of the order of two or three television lines.

During playback, timing pulses derived from the replayed video and from a pulse generator mounted on the headwheel motor shaft are combined to cause the recorder to switch from one head to another during the replay of the redundant information. This switching action is timed to take place at some point outside the active picture information. Typically, it is located at a point during the front porch of the horizontal blanking interval in an attempt to avoid interference with the synchronizing pulse and the burst signal which is located on the back porch of the horizontal blanking interval signal. Since the switching operation occurs in the frequency modulated (FM) domain, it is substantially impossible to have the FM carriers from the two heads exactly in-phase, and the switching point represents a sharp phase discontinuity in the signal output from the headwheel equivalent to an infinite change in frequency of the FM signal. During demodulation of the signal, this discontinuity will appear as a very large narrow spike occurring during the front porch of the horizontal blanking interval.

In general, the practice in the prior art has been to suppress the switching transient by clamping the signal level during the duration of the front porch. The clamping is usually done prior to any de-emphasis networks used in the playback apparatus since the de-emphasis networks, which are essentially a low-pass filter, transform the energy in the switching transient from a tall, narrow spike to a short, flat disturbance. This disturbance can extend from the front porch into the leading edge of sync distorting the timing of those sync pulses occurring just after the head switching takes place. In a quadruplex VTR, the result in the picture is a left to right "pull" of every 16th television picture line.

Clamping of the switching transient prior to de-emphasis to avoid sync distortion results in yet another set of difficulties in signal processing. In the pre-emphasized signal, the clamping pulse produces a "notch" especially when the right edge of the picture is white. The resulting de-emphasis of this "notch" produces disturbances in sync timing which are almost as objectionable as those produced by the signal switching transient. A further difficulty exists in any method used to clamp the switching transients because although the front porch signal duration is specified; e.g., NTSC standards, and the so-called narrow front porch is out of specification, such narrow front porches occur very often in tape recordings. A recorded video picture signal having such a narrow front porch will have the "notch" so close to sync that the difference between white right edge and black right edge pictures will produce non-identical disturbances in sync timing. The result is a "pull" in the picture which follows the motion of any white object near the right side of the picture.

SUMMARY OF THE INVENTION

A recorder-reproducer system for playback of a record medium of successive image representative video signals comprises signal pickup means for recovering from the record medium a signal having an instantaneous frequency representative of said successive images. The system further includes synchronizing means for maintaining synchronism between the signal pickup means and the record medium. The synchronizing means includes selection means for selectively switching the signal pickup means. Detecting means coupled to the pickup means. A video output terminal. Delay means providing between an input and an output terminal a signal delay of a time duration substantially corresponding to a period at the line frequency of the image representative video signals. Means for normally coupling the output signals of the detecting means to an input terminal of the delay means and to the video output terminal. Means for deriving a substitution signal from the output terminal of the delay means. Sensing means including means responsive to signals derived from the selection means for sensing the switching of the signal pickup means, and switching means responsive to the output signal of the sensing means for disabling the means for normally applying the output signal of the detecting means and concomitantly activating the application of the substitution signal to the video output terminal when the signal pickup means switching is sensed by the sensing means.

The above features and advantages of the present invention will become apparent with reference to the following detailed description taken in conjunction with the accompanying drawing in which:

FIG. 1 is a block diagram of a portion of a video recorder-reproducer including a defect compensator constructed in accordance with the present invention which provides for a three-mode compensation capability; and FIG. 2 illustrates waveforms representing the operation of the apparatus of FIG. 1.

In FIG. 1, RF signals, which are typically in the form of a carrier wave frequency modulated by chrominance, luminance and synchronizing signal components, are recovered from a magnetic tape 11 by means of a transducer head 13. The signals customarily are recovered by means of a plurality of heads which contact the tape 11 in predetermined sequence, the particular head on the tape being coupled by means of an RF switcher, amplifier-limiter 15 to an FM demodulator network 17 which demodulates the frequency modulated signals. The demodulated signals from FM demodulator unit 17 are coupled to a 1H delay network 27 by means of a first switching network 21. The 1H delayed signal is applied to a low-pass filter 29 and to a bandpass filter 31 for the purposes of separating the chrominance and the luminance information in the composite signal. The output signal of bandpass filter 31, substantially the chrominance portion of the video signal, is applied to a phase inverting network 33 where its phase is altered by 180°. The output signals of low-pass filter 29 and phase inverter unit 33 are applied to a summing network 35 and the combined signal output of summer 35 is applied to a second switching network 23. The elements 27-35 form a signal delay and processing unit 101.

The frequency modulated signal from the RF switcher, amplifier-limiter 15 is also monitored by a defect detector 19 which, for example, may be essentially an envelope detector wherein dropouts are sensed. In that case, the detector 19 provides an indication when a dropout is present in the frequency modulated signals from the RF switching unit 15. The output of dropout detector unit 19 is coupled to switching networks 21, 23 through OR gate 18.

Switching networks 21-23 may be an essentially conventional device of a type normally used for television broadcast effects switching and for keyed insertion of program material with emphasis on short switching time and elimination of incidental or generated switching transients. The 1H delay network 27; e.g., a glass delay line of conventional design, is designed to operate over a passband of 2 to 4 MHz and is capable of providing a delay, for example, of 63.5 microseconds (U.S. NTSC standards) so as to delay the video information for one line.

The demodulated video output signal selected (as will be explained below) by switching units 21, 23 is coupled to a headwheel servo system 100 which may be of the type shown in U.S. Pat. No. 3,542,950 of Arch Luther and Robert Breed and which is assigned to the assignee of the instant application. In such an arrangement, the video output signal is fed to a sync separator unit 39 wherein the horizontal synchronizing pulses are extracted and applied to a phase comparator 43, preferably of the sample and hold type. The output signal of a master timing generator 41, usually termed a studio generator, which provides timing reference signals, is also fed to phase comparator unit 43. Phase comparator 43 compares the phase of these two signals (sync and reference) and generates an appropriate error signal which is applied to a headwheel modulator unit 45. A tone wheel servo system 47 is also employed to maintain headwheel synchronization. Pulses from a tone wheel 51 are supplied via a pickup 53 to correct for velocity and position errors of the headwheel 13. Error signals from phase comparator 43 and tone wheel servo system 47 are coupled to a headwheel motor 49 through a modulator unit 45 for maintaining headwheel lock-up.

In the operation of the system shown in FIG. 1, the frequency modulated signal is reproduced from the record medium 11 by means of pickup transducer head 13. When no dropouts are present in the reproduced signal, the switches 21 and 23 will be in the positions illustrated. In that case, the demodulated composite signal from FM demodulation unit 17 is simultaneously directly applied to the video output terminal 25 through summing network 61 and to the 1H delay network 27 through switching network 21. Defect detector network 19 functions as a level detector and generates a pulse whenever the amplitude of the radio frequency signal from RF switching network 15 drops below a predetermined level; i.e., signifying the occurrence of a dropout.

When the dropout detector unit 19 detects a dropout, the video switching unit 21 is switched such that the direct output from FM demodulator 17 is decoupled from video output terminal 25 and from the input terminal to the signal delay and processing network 101. At the same time, the pulse output of dropout detector 19 causes switching unit 23 to change its state so as to couple the output of signal delay and processing network 101 to the video output terminal 25. In the network 101, the composite demodulated video signal is applied to the 1H delay network 27 which delays the video information by approximately one horizontal line (e.g., 63.5 microseconds). The delayed output of 1H delay network 27 is split into two paths. This arrangement is necessitated by the phase relationship between the scanning sync and color sync information with respect to adjacent image lines. The scanning sync pulses are in-phase from line to line, but the color information is interlaced or 180° out-of-phase from line to line to accommodate the odd multiple of line frequency in the case of a signal recorded in the NTSC format. It can be seen, therefore, that the scanning sync and color information must be separated so that the color information may be phase inverted to insure a proper phase relationship when the delayed video signal is reinserted into adjacent lines. The low-pass filter 29 passes frequencies below 2.5 MHz which substantially includes all the luminance information and the scanning sync pulses. Bandpass filter unit 31 has a passband, for example, from 2 to 4 MHz and substantially passes the color information. The color information from bandpass filter unit 31 is coupled to inverting unit 33 where the signals are reversed in-phase to correct for the interlaced format. Both the luminance information, including the scanning sync signal, and the inverted color information are applied to summing unit 35 which provides a composite output signal having an appropriate delay and phase relationship so as to be used as a dropout compensation signal. The output signal from summing unit 35 is coupled via contact B of switch 23 to the input terminal of delay line 29 and to the video output terminal 25 through summing network 61 for a period dependent upon the dropout.

The dropout compensation system, as described above, eliminates the shortcomings and resultant adverse effects upon the recording servo systems associated with image signal dropouts but will not solve the problem as previously discussed associated with switching transients.

In FIG. 1, the structure of the defect compensator is shown to further include head switching pulse shaper 20 coupled to RF switcher 15. Pulse shaper 20 operates to couple the head switching signal which occurs every 16th television line to OR gate 18. Although the head switching signal is discussed as occurring every 16th television line, it is understood that the head switching signal periodically occurs every 17th line in accordance with the NTSC quadruplex recording system standards. This arrangement provides for stimulation of the DOC either by the normal defect detector 19, as previously described, or by a pulse derived from the head switching signal. Generally, the head switching pulse is slightly advanced by means of the headwheel pulse generator and then lengthened by the pulse shaper 20 to provide a duration of approximately 1 microsecond approximately centered during the front porch period. Thus, the output pulse of pulse shaper 20 is well within the 1.2 microsecond period of the front porch and encompasses the typical switching transient of 0.25 microsecond as shown in FIG. 2, waveform B.

The waveforms of FIG. 2 illustrate the operation of the apparatus of FIG. 1 when a switching transient occurs. FIG. 2, waveform A illustrates the horizontal blanking interval of a normal television line; e.g., the line of a quadruplex VTR output signal preceeding the line during which the switching occurs.

As previously explained, during the overlap between the television lines, the head switch is made and the switching transient illustrated by waveform B occurs.

Waveform C represents the headwheel switching pulse slightly advanced by the headwheel pulse generator and lengthened by head switching pulse shaper 20.

When the switching transient occurs, switching systems 21 and 23 are activated by the pulse shaper 20 for a period of time $a'' - b''$ as illustrated in waveform C. This results in the portion $a - b$ of waveform B being removed (switch 21 open), and the information from the previous line portion $a' - b'$ of waveform A being inserted into the video synchronizing systems by switch 23 and delay system 101. The result is an extremely clear, pull-free picture in the presence of narrow front porches as well as white right edges.

In a typical VTR installation, the DOC, including the transient switch defect mode, is moved from its conventional location in the signal processing system where it handles de-emphasized video to a point ahead of the de-emphasis network. This is to permit the removal of the switching transient before it becomes blurred by the de-emphasis networks.

It should be noted that although in the preferred embodiment a quadruplex VTR is described, the invention is applicable to apparatus using any number of signal pickup heads and also is applicable to a single head recorder in which the pickup head is switched between two or more tracks.

What is claimed is:

1. In a recorder-reproducer system for playback of a record medium of successive image representative video signals, said system including signal pickup means for recovering from said record medium, a signal having an instantaneous frequency representative of said successive images, said system further including synchronizing means for maintaining synchronism between said signal pickup means and said record medium, said synchronizing means further including selection means for selectively switching said signal pickup means and detecting means coupled to said pickup means, the combination comprising:
   a video output terminal;
   delay means providing between an input and an output terminal a signal delay of a time duration substantially corresponding to a period at the line frequency of said image representative video signals;
   means for normally coupling the output signals of said detecting means to an input terminal of said delay means and to said video output terminal;
   means for deriving a substitution signal from the output terminal of said delay means;
   first sensing means responsive to the output signals derived from said signal pickup means for sensing abnormal conditions of signal recovery by said pickup means;
   second sensing means responsive to signals derived from said selection means for sensing the switching of said signal pickup means; and
   switching means responsive to the output of said first and said second sensing means for disabling said means for normally applying the output of said detecting means and concomitantly activating the application of said substitution signal to said video output terminal when said abnormal condition is sensed by said first sensing means or when said signal pickup means switching is sensed by said second sensing means.

2. Apparatus in accordance with claim 1 in which said video signals represent successive horizontal lines of an image and wherein said delay means delays said reproduced signal by a time interval constituting one horizontal line of said image.

3. Apparatus in accordance with claim 1 in which said means for sensing abnormal conditions of FM signal recovery by said pickup means comprises an envelope detector.

4. Apparatus according to claim 1 in which said means for sensing said pickup means switching comprises a pulse generator coupled to said synchronizing system to provide a signal indicative of a pickup means switching condition.

5. Apparatus according to claim 1 wherein said first and second sensing means are coupled to said switching means through an OR circuit.

6. In a recorder-reproducer system for playback of a record medium of successive image representative video signals, said system including multiple pickup means for recovering from said record medium an FM signal having an instantaneous frequency representative of a composite video signal, said system further including synchronizing means for maintaining synchronism between said multiple pickup means and said record medium, said synchronizing means further including selection means for selectively switching between said multiple pickup means and frequency modulation detecting means coupled to said pickup means for deriving from said FM signal, said composite signal having at least a signal component representative of the luminance of said image, said luminance signal portion occupying a given frequency band, the combination comprising:

a video output terminal;

delay means providing between an input and an output terminal a signal delay of a time duration substantially corresponding to a period at the line frequency of said image representative video signals;

means for normally coupling the output signals of said frequency modulation detecting means to an input terminal of said delay means and to said video output terminal;

means for deriving a substitution signal from the output terminal of said delay means;

first sensing means responsive to the output signals derived from said multiple pickup means for sensing abnormal conditions of FM signal recovery by said pickup means;

second sensing means responsive to signals derived from said selection means for sensing the switching from one of said multiple pickup means to another of said multiple pickup means; and switching means responsive to the output of said first and said second sensing means for disabling said means for normally applying the output of said FM detecting means and concomitantly activating the application of said substitution signal to said video output terminal when said abnormal condition is sensed by said first sensing means or when said signal pickup means switching is sensed by said second sensing means.

* * * * *